(12) United States Patent
Lo (10) Patent No.: US 8,015,512 B2
(45) Date of Patent: Sep. 6, 2011

(54) SYSTEM FOR DESIGNING MASK PATTERN

(75) Inventor: Chao-Lung Lo, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 146 days.

(21) Appl. No.: 12/433,458

(22) Filed: Apr. 30, 2009

(65) Prior Publication Data

US 2010/0279211 A1 Nov. 4, 2010

(51) Int. Cl.
*G06F 17/50* (2006.01)

(52) U.S. Cl. ............... 716/50; 716/53; 716/55

(58) Field of Classification Search ........... 716/50, 716/53, 55; 430/5
See application file for complete search history.

(56) References Cited

U.S. PATENT DOCUMENTS

| | | | | |
|---|---|---|---|---|
| 5,484,671 | A * | 1/1996 | Okamoto | 430/5 |
| 6,556,277 | B2 * | 4/2003 | Pierrat | 355/53 |
| 2002/0006553 | A1 * | 1/2002 | Kikuchi | 430/5 |
| 2005/0074677 | A1 | 4/2005 | Laidig et al. | |
| 2007/0184359 | A1 * | 8/2007 | Misaka | 430/5 |
| 2007/0231714 | A1 * | 10/2007 | Minami | 430/5 |
| 2009/0314965 | A1 * | 12/2009 | Wu et al. | 250/492.22 |

\* cited by examiner

*Primary Examiner* — Stacy A Whitmore
(74) *Attorney, Agent, or Firm* — J.C. Patents (57) ABSTRACT

The invention is directed to a method for designing an assistant pattern of a mask pattern on a mask. The mask pattern has an assistant pattern arrangement region around a main pattern. The method comprising defining a reverse pattern of the main pattern. The reverse pattern is shrunken to be a first shrunken pattern with a first shrinking proportion and a first margin placed within the assistant pattern arrangement region. The reverse pattern is shrunken to be a second shrunken pattern with a second shrinking proportion and a second margin placed within the assistant pattern arrangement region. The first shrunken pattern and the second shrunken pattern are merged to define an assistant pattern of the mask pattern, wherein the assistant pattern entirely surrounds the main pattern.

5 Claims, 13 Drawing Sheets

SYSTEM FOR DESIGNING MASK PATTERN

BACKGROUND OF THE INVENTION

1. Field of Invention

The present invention relates to a method for designing a mask pattern. More particularly, the present invention relates to a method for designing an assistant pattern surrounding a main pattern on a mask.

2. Description of Related Art

As the integrated circuit is highly developed, the reduction and integration of the device become an inevitable tendency and are the main development task for the industry. In the manufacturing process of the integrated circuit, the photolithography process becomes a primary key for determining the device properties. With the increasing of the integration of the device, the size of the device is reduced and the distance between the devices is reduced as well. Therefore, the deviation occurs as the pattern is transferred from the mask to the material layer in the photolithography process. The deviation is relatively small when the size of the device is large and the integration of the device is low. Nevertheless, in the integrated circuit with high integration, the device properties are seriously affected. Therefore, the electrical performance of the device is seriously affected.

Figure 11:
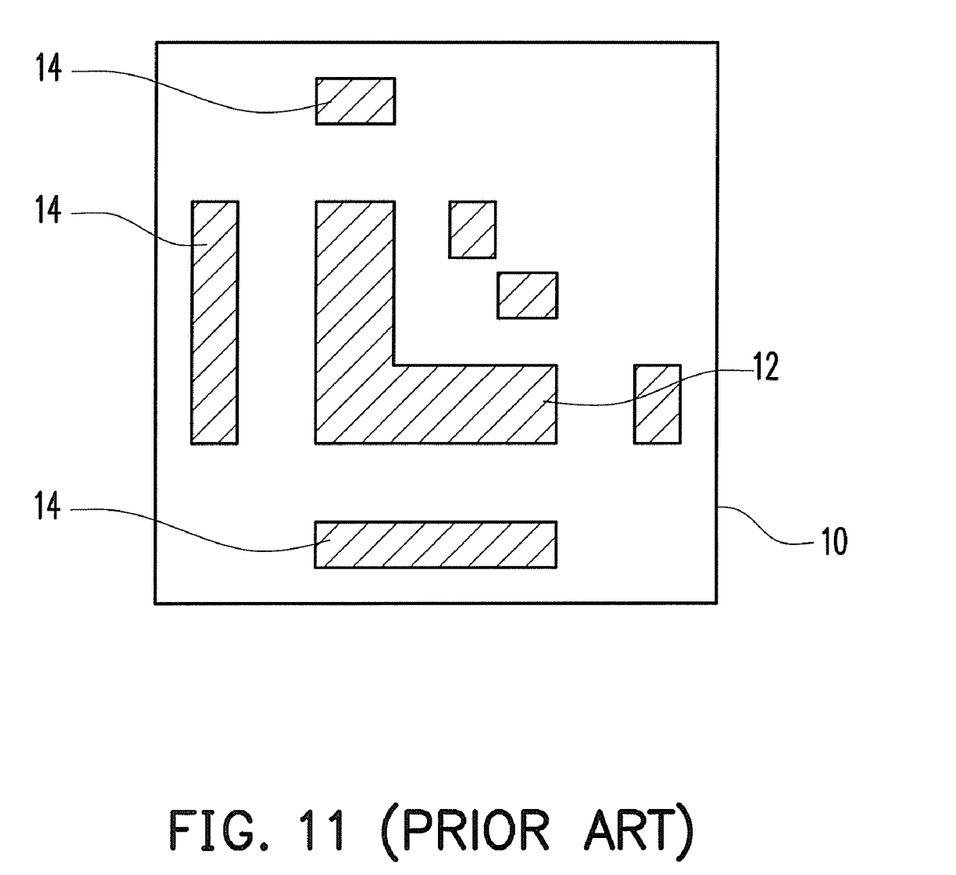
FIG. 11 is a top view schematically showing a conventional mask pattern.

In order to overcome the pattern distortion problem occurring while the pattern is transferred, several assistant patterns are interleaved between the device patterns on the mask so that the distortion of the device pattern occurring during the device pattern is transferred can be reduced by utilizing the optical effect. FIG. 11 is a top view schematically showing a conventional mask pattern. As shown in FIG. 11, a main pattern 12 on a semiconductor layout 10 to be transferred is provided. For each edge of the main pattern 12, there is an assistant pattern 14 arranged apart from the corresponding edge of the main pattern 12. During designing the arrangement of the assistant patterns 14 on the layout 10, each assistant pattern 14 is arranged along the corresponding edge of the main pattern 12 and then each assistant pattern 14 is shortened to prevent from overlapping each other. More particularly, around the corners of the main patterns, the coverage ratio of the assistant patterns to the main pattern is worse. Hence, the total coverage ratio of the assistant patterns 14 to the main pattern 12 is poor. Therefore, the lithography weak points occurs around the poor coverage region of the main pattern 12 and the distortion of the resulted pattern on the target material layer after the photolithography process happens as well.

SUMMARY OF THE INVENTION

Accordingly, at least one objective of the present invention is to provide a method for designing an assistant pattern surrounding a main pattern on a mask with a full coverage.

At least another objective of the present invention is to provide a mask pattern having an assistant pattern surrounding a main pattern on a mask with a full coverage.

To achieve these and other advantages and in accordance with the purpose of the invention, as embodied and broadly described herein, the invention provides a design system for designing a mask pattern for a given main pattern on a mask. The given main pattern has an assistant pattern arrangement region around the given main pattern. The design system comprises a defining module, an adjustment module, a merging module and a reverse module. The defining module is used for defining a complementary pattern of the given main pattern and the complementary pattern is a complement of a reverse-tone pattern of the given main pattern. The adjustment module is used for shrinking the complementary pattern to be a first shrunken pattern with a first shrinking proportion and to be a second shrunken pattern with a second shrinking proportion. Both of a first margin of the first shrunken pattern and a second margin of the second shrunken pattern are placed within the assistant pattern arrangement region and the first shrinking proportion is larger than the second shrinking proportion. The merging module is used for merging the first shrunken pattern and the second shrunken pattern to define a reverse assistant pattern and further merging the reverse assistant pattern and the reverse-tone pattern to define a reverse pattern. The first margin is an outer periphery of the reverse assistant pattern and the second margin is an inner periphery of the reverse assistant pattern. The reverse module is used for reversing the reverse pattern to be a mask pattern.

According to one embodiment of the invention, the reverse pattern is a reverse-tone pattern of the mask pattern.

According to one embodiment of the invention, the assistant pattern surrounds the main pattern.

According to one embodiment of the invention, the design system further comprises a fine tuning module for adjusting the reverse assistant pattern to form at least an interval therein around at least a position corresponding to a corner of the given main pattern.

According to one embodiment of the invention, a dimension of the interval is smaller than a resolution of an optical system used with the mask and the resolution is proportional to a wave length of a light source used in the optical system and is inverse proportional to a numerical aperture of a lens system used in the optical system.

The present invention also provides a mask pattern. The mask pattern comprises a main pattern and an assistant pattern. The assistant pattern with an integral frame shape surrounds the main pattern.

According to one embodiment of the invention, a coverage ratio of the assistant pattern to the main pattern is about 100%.

The invention further provides a mask pattern. The mask pattern comprises a main pattern and an assistant pattern. The assistant pattern has at least two sub-patterns arranged to surround the main pattern and an interval between the sub-patterns is smaller than a resolution of an optical system used with the mask pattern.

According to one embodiment of the invention, the resolution is proportional to a wave length of a light source used in the optical system and is inverse proportional to a numerical aperture of a lens system used in the optical system.

According to one embodiment of the invention, a coverage ratio of the assistant pattern to the main pattern is about 100%.

In the present invention, by re-sizing the reverse-tone pattern of the main pattern with different shrinking proportions, the assistant pattern can be defined to be in a shape of an integral frame to entirely surround the main pattern. Therefore, the coverage ratio of the assistant pattern to the main pattern is about 100%. Even though the assistant pattern is adjusted to have at least one interval therein, the dimension of the interval within the assistant pattern is controlled to be smaller than the resolution of the optical system which is used with the mask having the main pattern and the assistant pattern thereon. Hence, the coverage ratio of the assistant pattern to the main pattern is still improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
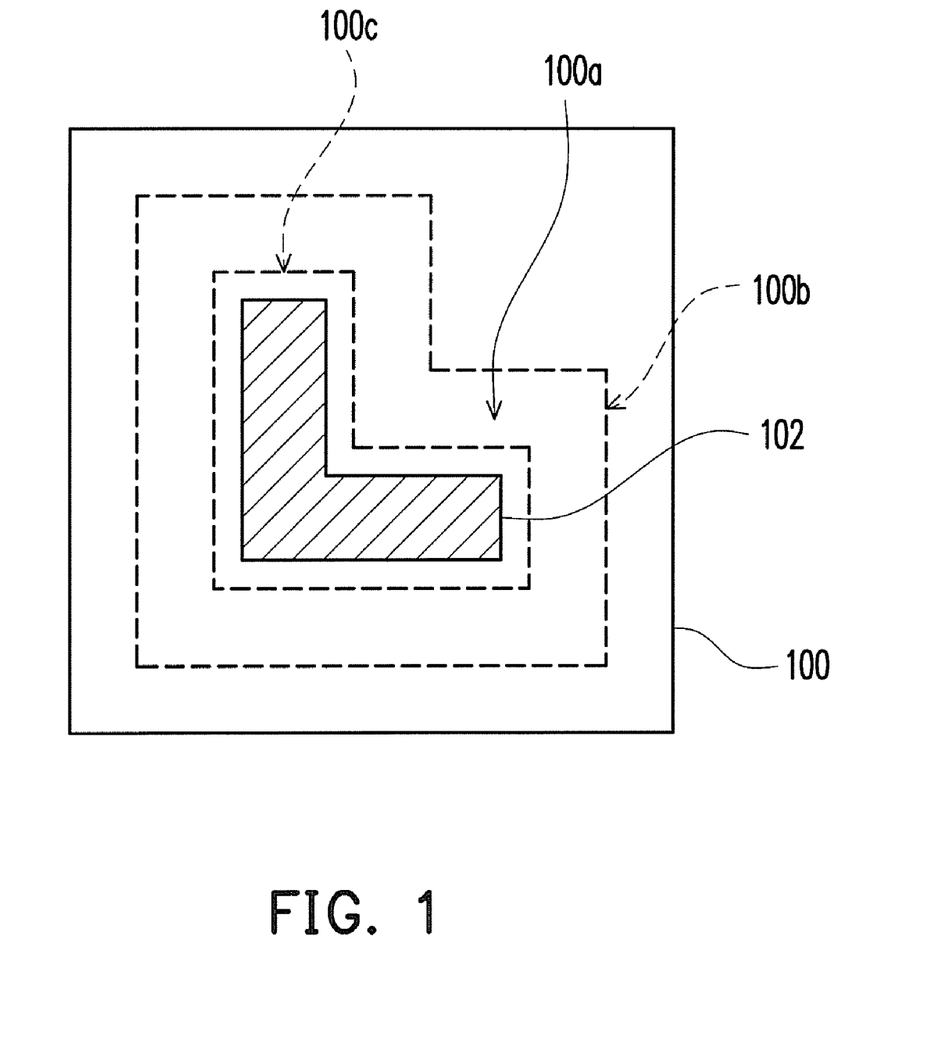
FIGS. 1 through 6 are schematic drawings illustrating a method for designing a mask pattern according to one embodiment of the invention.
Figure 5:
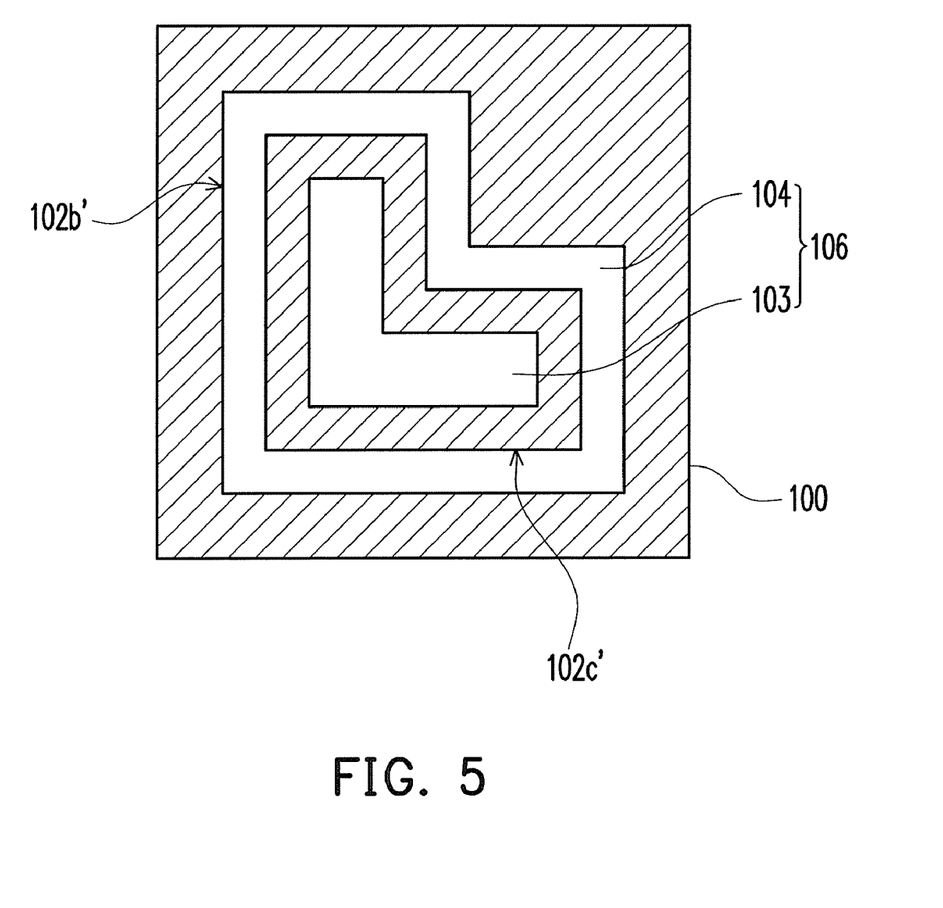
Figure 6:
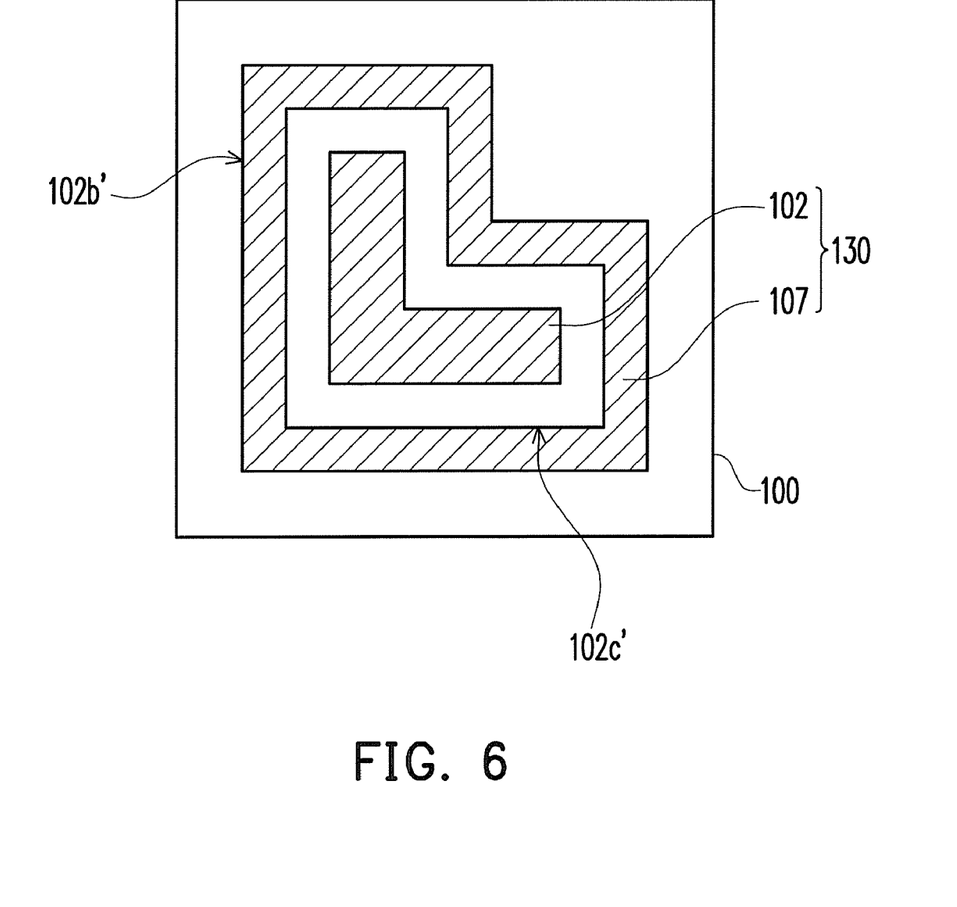
Figure 7:
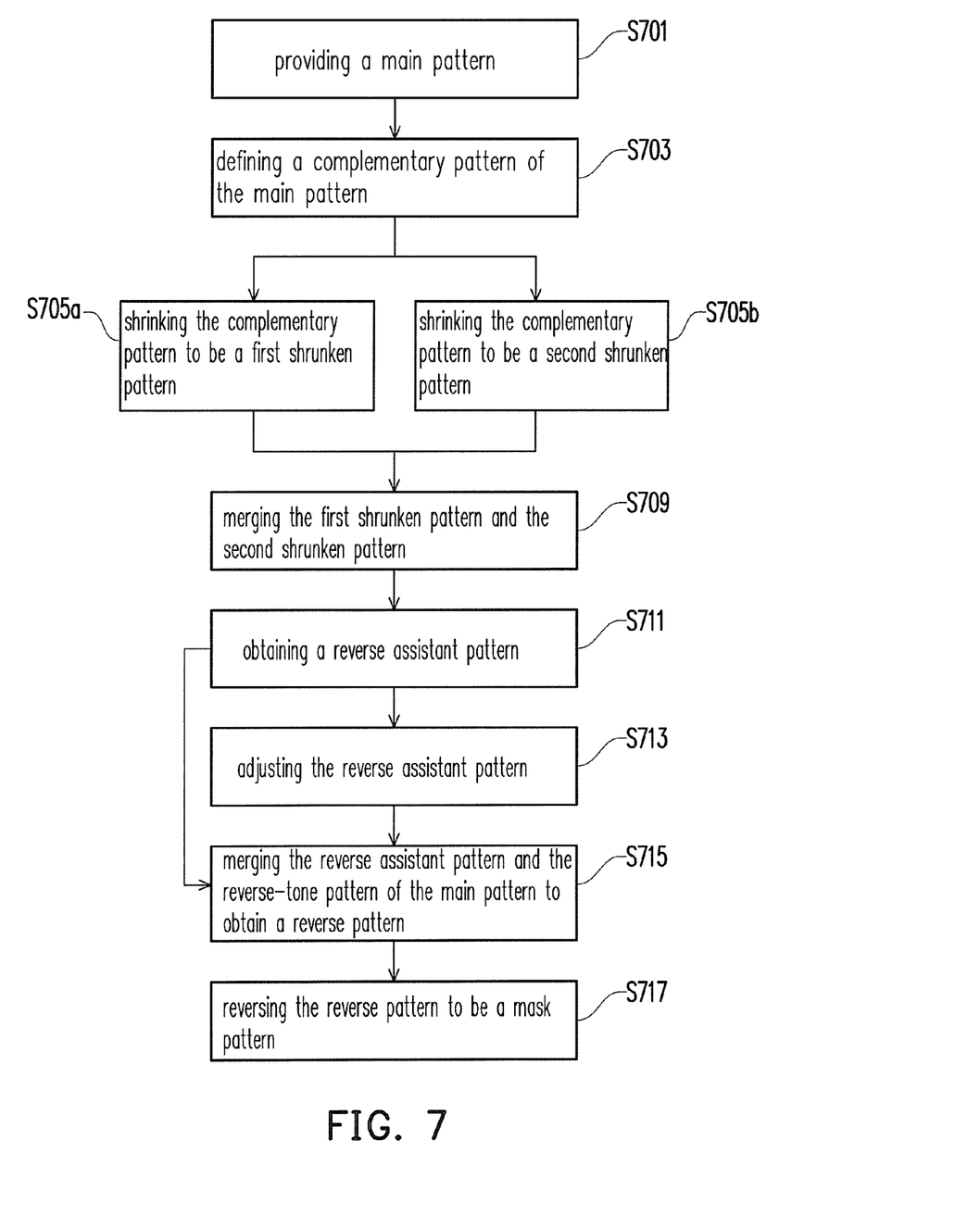
FIG. 7 is a flow chart showing a method for designing a mask pattern according to one embodiment of the invention.

FIGS. 1 through 6 are schematic drawings illustrating a method for designing a mask pattern according to one embodiment of the invention. FIG. 7 is a flow chart showing a method for designing a mask pattern according to one embodiment of the invention. As shown in FIG. 1 and FIG. 7, a main pattern 102 on a semiconductor layout 100 is provided (step S701). The main pattern 102, for example but not limited to, can be a pattern with a polygon shape. Furthermore, the main pattern 102 can be used to define, for example, a semiconductor element such as a word line, a gate structure, etc. On the semiconductor layout 100, there is an assistant pattern arrangement region 100a around the main pattern 102. It should be noticed that the assistant pattern arrangement region 100a is defined according to the exposure parameters of the optical system used with the mask having the main pattern thereon to perform a photolithography process so that the assistant patterns disposed within the assistant pattern arrangement region 100a would not be copied onto the target material layer on a wafer in the photolithography process. The exposure parameters include the exposure intensity, the numerical aperture and the wave length of the light source used in the optical system. On the other words, the assistant patterns disposed within the assistant pattern arrangement region 100a can prevent the assistant patterns from being transferred onto the target material layer due to the location of the assistant patterns too far away from the main pattern and from being ineffective due to the location of the assistant patterns too close to the main pattern.

Figure 2:
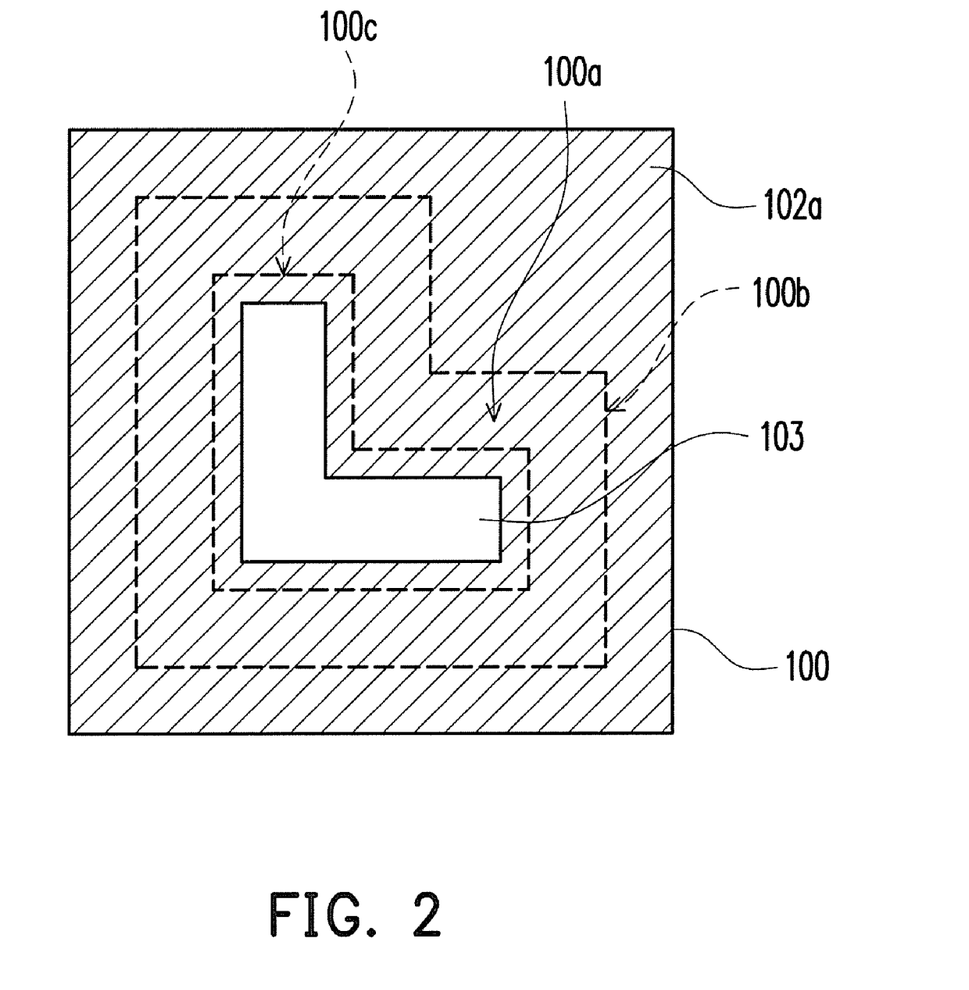
Figure 3A:
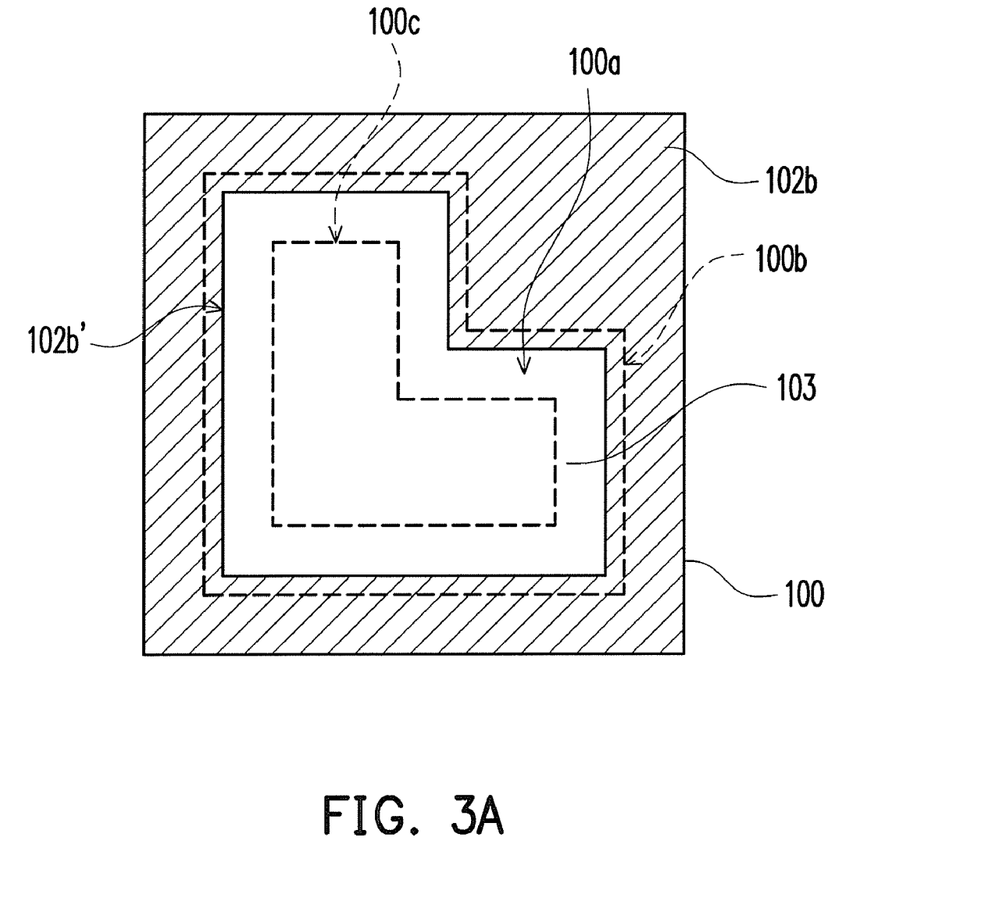

As shown in FIG. 2 and FIG. 7, a complementary pattern 102a of the main pattern 102 is defined (step S703). It should be noticed that the complementary pattern 102a is a complementary of the reverse-tone pattern 103 of the main pattern 102. Then, as shown in FIG. 3A and FIG. 7, in the step S705a, the complementary pattern 102a is shrunken to be a first shrunken pattern 102b with a first shrinking proportion. The first enlarging proportion is customized according to the exposure parameters mentioned above. Noticeably, the inner margin 102b' of the first shrunken pattern 102b is placed within the assistant pattern arrangement region 100a. That is, for the assistant pattern arrangement region 100a having an outer margin 100b and an inner margin 100c shown in FIG. 1, the size of the region encircled by the inner margin 102b' of the first shrunken pattern 102b is larger than the area circled by the inner margin 100c of the assistant pattern arrangement region 100a but smaller than the area circled by the outer margin 100b of the assistant pattern arrangement region 100a.

Figure 3B:
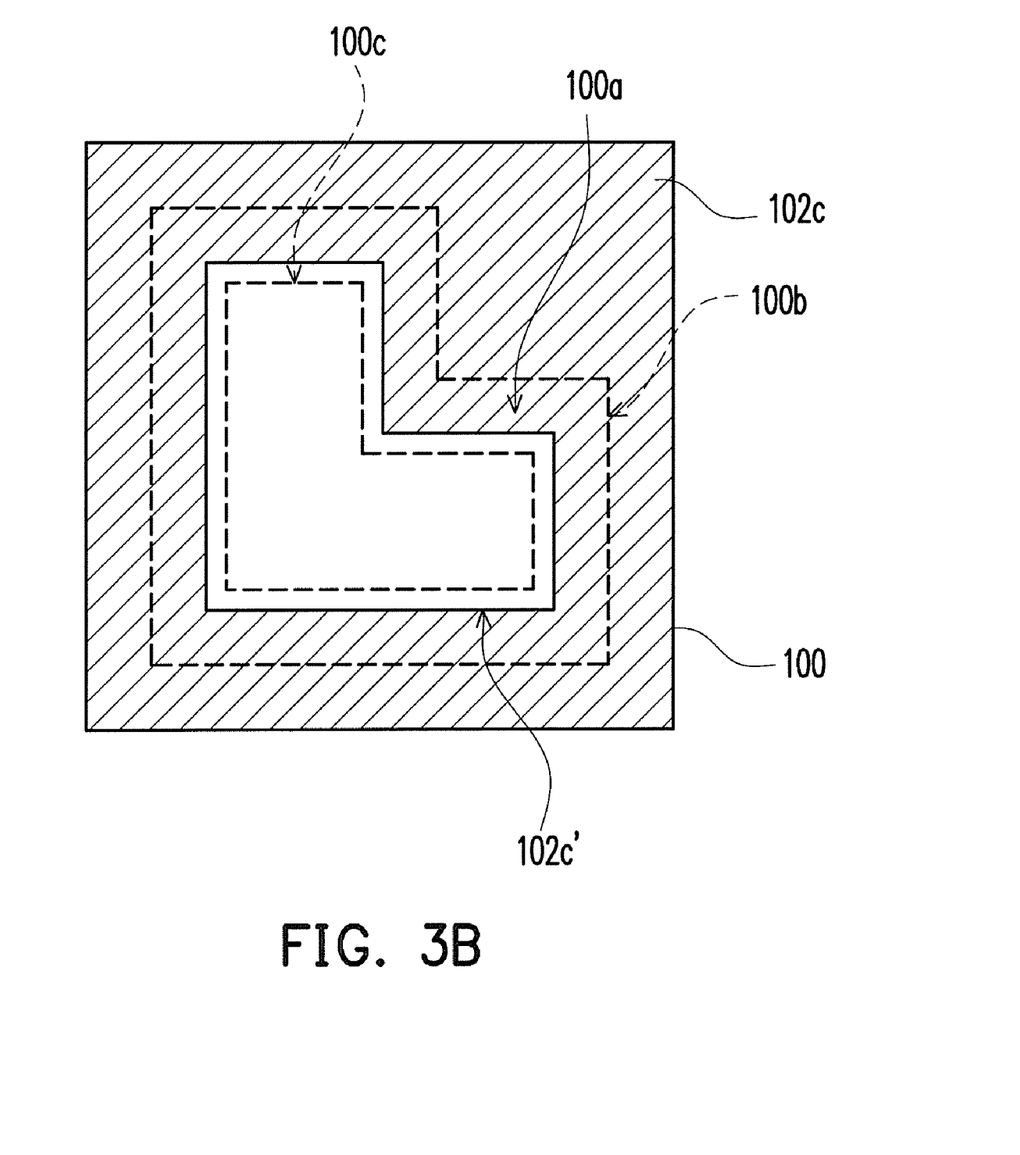

As shown in FIG. 3B and FIG. 7, in the step S705b, the original complementary pattern 102a is shrunken to be a second shrunken pattern 102c with a second shrinking proportion. Similar to the first proportion, the second shrinking proportion is customized according to the exposure parameters mentioned above. That is, the first proportion and the second proportion are customized according to the dimension and the arrangement of the desired assistant pattern of the main pattern. Noticeably, the inner margin 102c' of the second shrunken pattern 102c is placed within the assistant pattern arrangement region 100a. That is, for the assistant pattern arrangement region 100a having an outer margin 100b and an inner margin 100c shown in FIG. 1, the size of the region encircled by the inner margin 102c' of the second shrunken pattern 102c is larger than the area circled by the inner margin 100c of the assistant pattern arrangement region 100a but smaller than the area circled by the outer margin 100b of the assistant pattern arrangement region 100a. Moreover, the first shrinking proportion is different from the second shrinking proportion. In the present embodiment, the first shrinking proportion is larger than the second shrinking proportion so that the size of the first shrunken pattern 102b is larger than the second shrunken pattern 102c.

Figure 4:
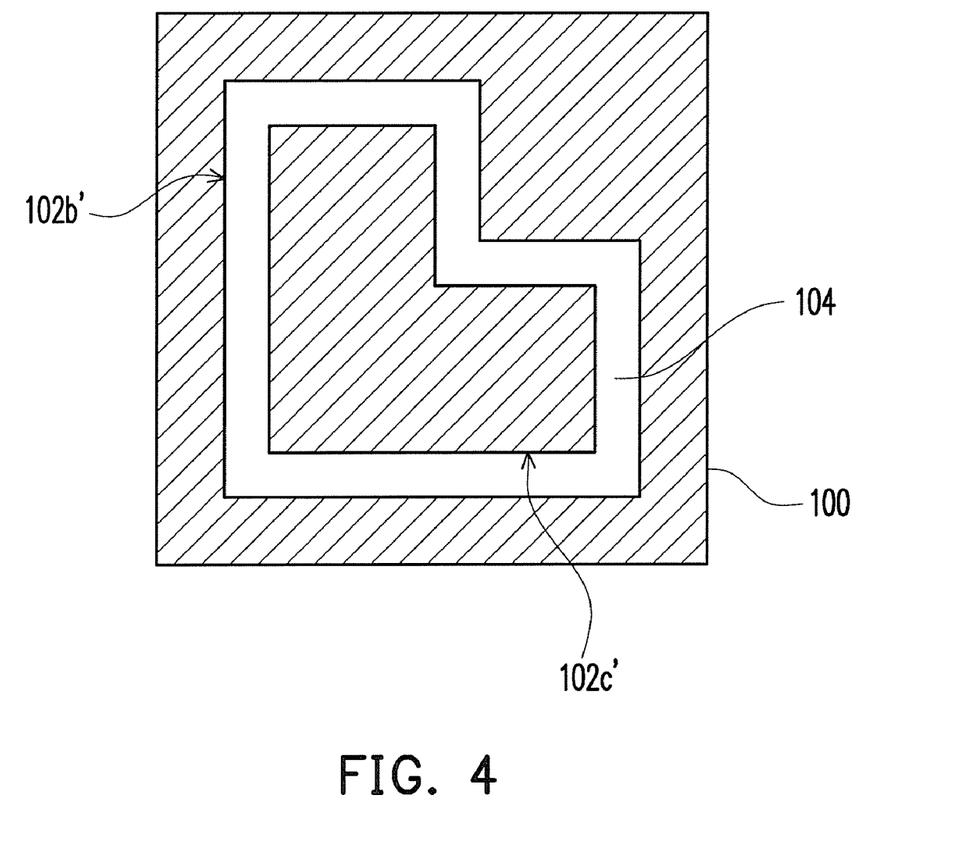

As shown in FIG. 4 and FIG. 7, in the step S709 followed by the step S711, the first shrunken pattern 102b and the second shrunken pattern 102c are merged to obtain a reverse assistant pattern 104. That is, since the size of the region encircled by the inner margin 102b' of the first shrunken pattern 102b is larger than that of the second shrunken pattern 102c, the first margin 102b' is an outer periphery of the reverse assistant pattern 104 and the second margin 102c' is an inner periphery of the reverse assistant pattern 104.

As shown in FIG. 5 and FIG. 7, in the step S715, the reverse assistant pattern 104 and the reverse-tone pattern 103 of the main pattern 102 shown in FIG. 2 are merged to obtain a reverse pattern 106. Then, the reverse pattern 106 is reversed to be a mask pattern 130 as shown in FIG. 6 (step S717). That is, the reverse pattern 106 is a reverse-tone pattern of the mask pattern 130 which includes the main pattern 102 and the assistant pattern 107 encircling the main pattern 102. It should be noticed that, as shown in FIG. 6, the assistant pattern 107 designed according to the method of the present invention is in a shape of an integral frame, which is conformal to the shape of the main pattern in order to entirely surround the main pattern 102. Consequently, the coverage ratio of the assistant pattern 106 to the main pattern 102 is about 100%.

Figure 8:
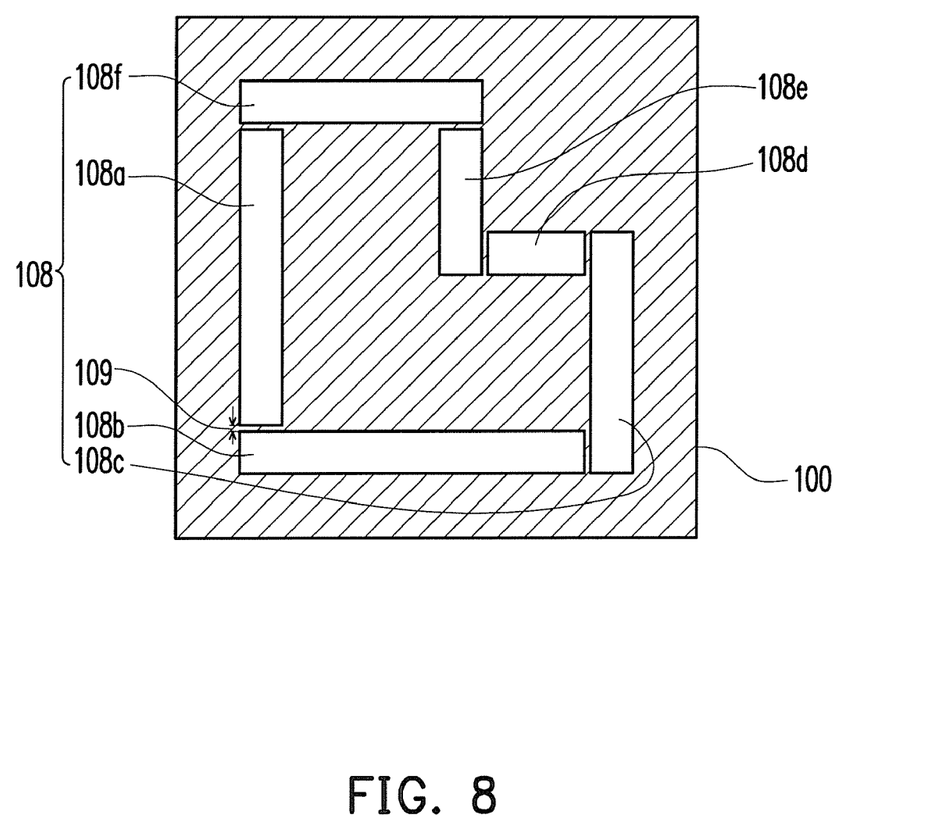
FIGS. 8 through 10 are schematic drawing illustrating a method for adjusting a reverse assistant pattern to form a mask pattern according to another embodiment of the invention.
Figure 9:
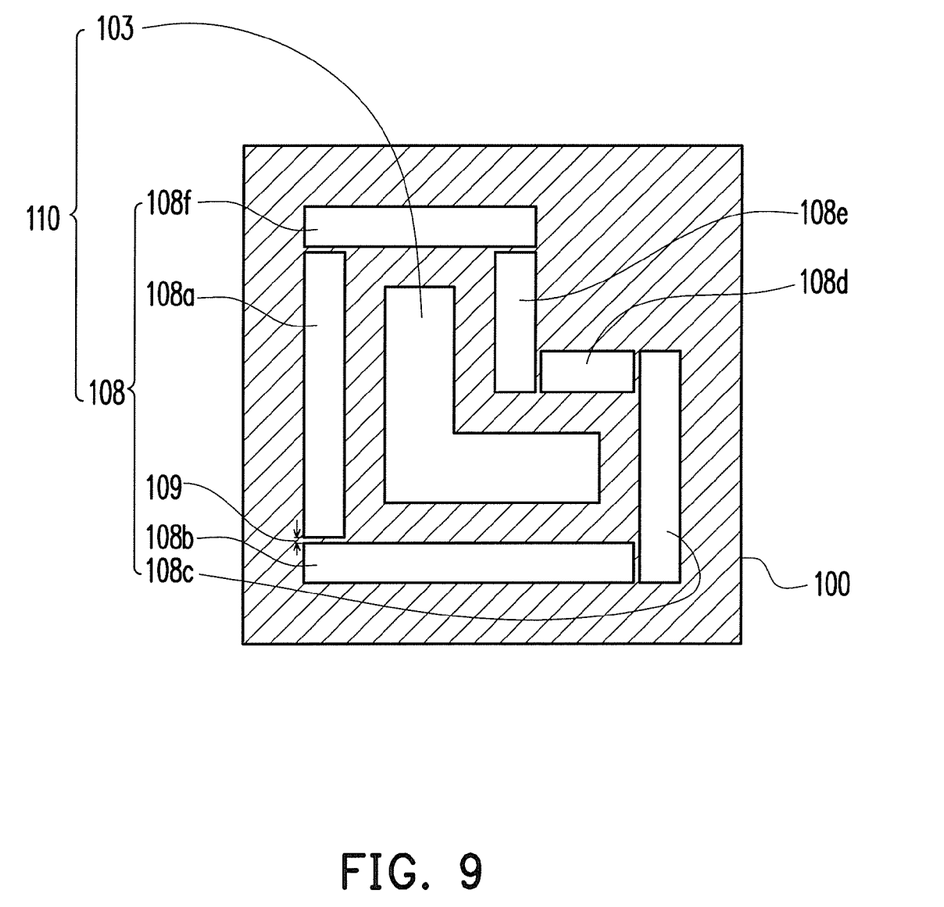
Figure 10:
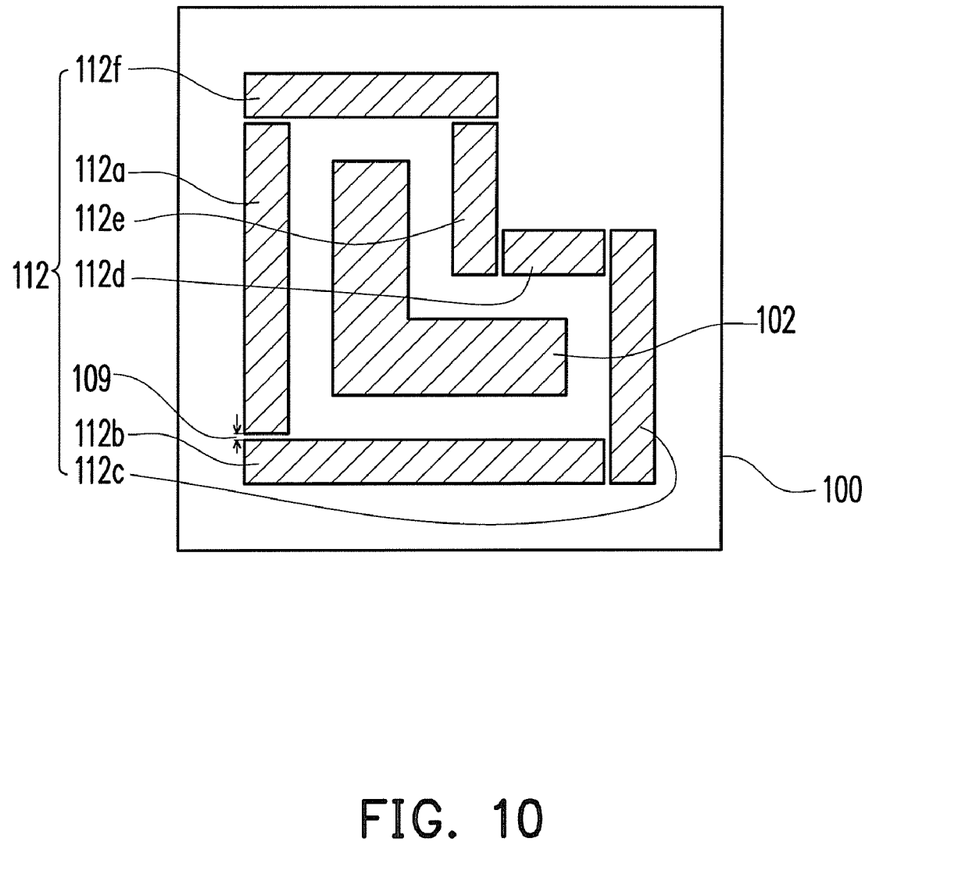

FIGS. 8 through 10 are schematic drawing illustrating a method for adjusting a reverse assistant pattern to form a mask pattern according to another embodiment of the invention. In another embodiment of the present invention, as shown in FIG. 8 and FIG. 7, before the reverse assistant pattern 104 is merged with the reverse-tone pattern 103 of the main pattern 102 (step S715), the reverse assistant pattern 104 is adjusted to form a reverse assistant pattern 108 having at least an interval 109 therein around at least a position corresponding to a corner of the main pattern 102 (as shown in FIG. 1) according to the practical requirement (step S713). That is, the reverse assistant pattern 104 is adjusted to form the reverse assistant pattern 108 having at least two sub-patterns such as the sub-patterns 108a~108f. The neighboring sub-patterns such as sub-patterns 108a and 108b are separated from each other by the interval 109 and the location of the interval 109 is corresponding to the corner of the main pattern 102 shown in FIG. 1. It should be noticed that, a dimension of the interval is smaller than the resolution of the optical system, which is used with the mask having the main pattern and the assistant pattern formed thereon. The resolution of the optical system is proportional to the wave length of the light source used in the optical system and is inverse proportional to the numerical aperture of the lens system used in the optical system. More particularly, the resolution can be defined according to the following equation based on the Rayleigh criterion:

$$R = k \times \left(\frac{\text{Wave\_length}}{NA}\right),$$

wherein R represents the resolution of the optical system, Wave_length represents the wave length of the light source of the optical system, NA represents the numerical aperture of the lens system of the optical system and k is the process factor of about 0.25~0.5 for the incoherent illumination and the coherent illumination respectively.

Thereafter, as shown in FIG. 9 and FIG. 7, in the step S715, the reverse assistant pattern 108 is merged with the reverse-tone pattern 103 of the main pattern 102 to obtain a reverse pattern 110. Then, in the step S717, the reverse pattern 110 is transformed to be a mask pattern 140 complete the design of the mask pattern (as shown in FIG. 10). It should be noticed that, the reverse pattern 110 is the reverse-tone pattern of the mask pattern 140 and the mask pattern 140 includes the main pattern 102 and the assistant pattern 112 having at least two sub-patterns such as the sub-patterns 112a~112f. As shown in FIG. 10, the sub-patterns 112a~112f of the assistant pattern 112 are arranged to surround the main pattern 102. Even though there are intervals between the sub-patterns 112a~112f, the coverage ratio of the assistant pattern 112 to the main pattern 102 is still greatly improved and is even close to 100%.

Figure 12:
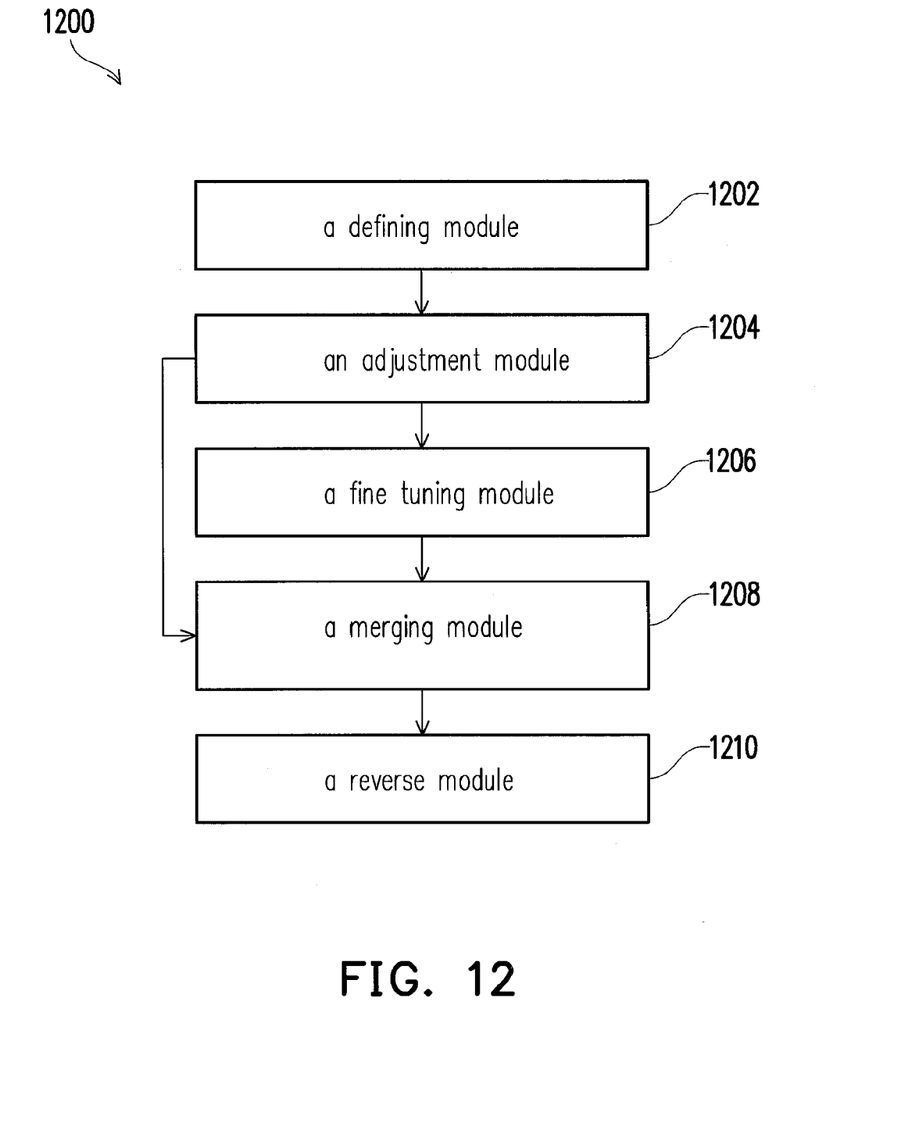
FIG. 12 is a schematic view showing a design system for designing a mask pattern according to one embodiment of the present invention.

Further, FIG. 12 is a schematic view showing a design system for designing a mask pattern according to one embodiment of the present invention. As shown in FIG. 12 together with FIG. 7 and FIG. 1 through FIG. 7, the design system 1200 comprises a defining module 1202, an adjustment module 1204, a merging module 1208 and a reverse module 1210. The defining module 1202 is used for performing the step S703 to define the complementary pattern 102a of the given main pattern 102 shown in FIG. 1 and FIG. 2. The complementary pattern 102a is a complement of the reverse-tone pattern 103 of the given main pattern 102. The adjustment module 1204 is used for performing the steps S705a and S705b to shrink the complementary pattern 102a to be the first shrunken pattern 102b with the first shrinking proportion and to be the second shrunken pattern 102c with the second shrinking proportion as shown in FIG. 3A and FIG. 3B respectively. Both of the inner margin 102b' of the first shrunken pattern 102b and the inner margin 102c' of the second shrunken pattern 102c are placed within the assistant pattern arrangement region 100a. Under the circumstance mentioned above, the first shrinking proportion is larger than the second shrinking proportion.

The merging module 1208 is used for performing the steps S709 and S711 to merge the first shrunken pattern 102b and the second shrunken pattern 102c to define a reverse assistant pattern 104 shown in FIG. 4. The merging module 1208 is also used for performing the step S715 to merge the reverse assistant pattern 104 and the reverse-tone pattern 103 of the given main pattern 102 to obtain a reverse pattern 106 shown in FIG. 5. The inner margin 102b' is an outer periphery of the reverse assistant pattern 104 and the inner margin 102c' is an inner periphery of the reverse assistant pattern 104. Moreover, the reverse module 1210 is used for performing the step S717 to reverse the reverse pattern 106 to be a mask pattern 130.

Also, the design system 1200 further comprises a fine tuning module 1206 for performing the step S713 to adjust the reverse assistant pattern 104 to form at least an interval 109 therein around at least a position corresponding to a corner of the given main pattern 102 as shown in FIG. 8. Furthermore, the dimension of the interval 109 is smaller than a resolution of an optical system used with the mask. In addition, the resolution is proportional to a wave length of a light source used in the optical system and is inverse proportional to a numerical aperture of a lens system used in the optical system.

In the present invention, by re-sizing the complementary pattern of the reverse-tone pattern of the main pattern with different shrinking proportions, the assistant pattern can be defined to be in a shape of an integral frame to entirely surround the main pattern. Therefore, the coverage ratio of the assistant pattern to the main pattern is about 100%. Even though the assistant pattern is adjusted to have at least one interval therein, the dimension of the interval within the assistant pattern is controlled to be smaller than the resolution of the optical system which is used with the mask having the main pattern and the assistant pattern thereon. Hence, the coverage ratio of the assistant pattern to the main pattern is still improved.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A design system for designing a mask pattern for a given main pattern on a mask, wherein the given main pattern has an assistant pattern arrangement region around the given main pattern, the design system comprising:
   a defining module for defining a complementary pattern of the given main pattern by using a computer, wherein the complementary pattern is a complement of a reverse-tone pattern of the given main pattern;
   an adjustment module for shrinking the complementary pattern by using the computer to be a first shrunken pattern with a first shrinking proportion and to be a second shrunken pattern with a second shrinking proportion, wherein both of a first margin of the first shrunken pattern and a second margin of the second shrunken pattern are placed within the assistant pattern arrangement region and the first shrinking proportion is larger than the second shrinking proportion;
   a merging module for merging the first shrunken pattern and the second shrunken pattern by using the computer to define a reverse assistant pattern and further merging the reverse assistant pattern and the reverse-tone pattern to obtain a reverse pattern, wherein the first margin is an outer periphery of the reverse assistant pattern and the second margin is an inner periphery of the reverse assistant pattern; and
   a reverse module for reversing the reverse pattern to be a mask pattern by using the computer.

2. The design system of claim 1, wherein the reverse pattern is a reverse-tone pattern of the mask pattern.

3. The design system of claim 1, wherein the assistant pattern surrounds the main pattern.

4. The design system of claim 1 further comprising a fine tuning module for adjusting the reverse assistant pattern by using the computer to form at least an interval therein around at least a position corresponding to a corner of the given main pattern.

5. The design system of claim 4, wherein a dimension of the interval is smaller than a resolution of an optical system used with the mask and the resolution is proportional to a wave length of a light source used in the optical system and is inverse proportional to a numerical aperture of a lens system used in the optical system.

* * * * *

UNITED STATES PATENT AND TRADEMARK OFFICE
CERTIFICATE OF CORRECTION

PATENT NO. : 8,015,512 B2  
APPLICATION NO. : 12/433458  
DATED : September 6, 2011  
INVENTOR(S) : Chao-Lung Lo It is certified that error appears in the above-identified patent and that said Letters Patent is hereby corrected as shown below:

On the Title page item (54) & Column 1, line 1 replace title of invention from "System for Designing Mask Pattern" to -- Design System for Designing Mask Pattern --

Signed and Sealed this
Fourteenth Day of February, 2012

David J. Kappos
*Director of the United States Patent and Trademark Office*